United States Patent [19]
Gordy

[11] 3,961,288
[45] June 1, 1976

[54] DOUBLE SIDEBAND SUPPRESSED CARRIER MODULATOR USING SURFACE WAVE DEVICE

[75] Inventor: Robert S. Gordy, Largo, Fla.

[73] Assignee: NCR Corporation, Dayton, Ohio

[22] Filed: Apr. 28, 1975

[21] Appl. No.: 570,145

[52] U.S. Cl. ............................ 332/44; 325/138; 332/48; 333/30 R; 333/72
[51] Int. Cl.$^2$ .................. H03C 1/46; H03C 1/52
[58] Field of Search ............ 332/44, 26, 31 R, 31 T, 332/48–50; 329/117; 325/49, 138; 333/30 R, 72

[56] References Cited
UNITED STATES PATENTS

| | | | |
|---|---|---|---|
| 3,678,364 | 7/1972 | De Vries | 329/117 |
| 3,750,027 | 7/1973 | Hartmann | 333/72 X |
| 3,862,431 | 1/1975 | Quate et al. | 330/5.5 X |

Primary Examiner—Siegfried H. Grimm
Attorney, Agent, or Firm—J. T. Cavender; Albert L. Sessler, Jr.; Edward Dugas

[57] ABSTRACT

An apparatus and method for generating a double sideband suppressed carrier signal utilizing a surface wave device. Three equally spaced surface wave transducers are formed on a surface wave propagating medium along a common acoustic channel. An RF carrier signal is applied to one of the outer surface wave transducers and an RF carrier amplitude modulated signal is applied to the remaining outer surface wave transducer. The centrally positioned surface wave transducer receives the modulated and the unmodulated RF carrier signals transmitted by the transducers along the acoustic channel 180° out of phase. The received RF carrier signals cancel leaving the two sideband signals present at the centrally positioned transducer.

17 Claims, 3 Drawing Figures

DOUBLE SIDEBAND SUPPRESSED CARRIER MODULATOR USING SURFACE WAVE DEVICE

BACKGROUND OF THE INVENTION

This invention pertains to a modulator and a method of the type for generating a double sideband suppressed carrier (DSBSC) signal and more particularly to such a modulator which utilizes a surface wave device.

The generation of DSBSC signals by means of a balanced modulator has required relatively expensive elements such as transformers and modulating amplifiers. In addition the balanced modulator required exact tuning in order to cancel out the carrier signal. If a single sideband suppressed carrier signal was desired, a filter for blocking transmission of one of the sidebands was used.

Surface acoustic wave devices, known as SAW's, have been used as frequency discriminators because: they are compatible with integrated circuit techniques, they require very little tuning, and they are relatively inexpensive when compared against more conventional devices.

The particular advantages associated with utilizing SAW devices as frequency discriminators are retained when the SAW devices are used as a modulator.

SUMMARY OF THE INVENTION

In the preferred embodiment of the present invention three equally spaced surface wave transducing means are positioned on a surface wave propagating medium along a common acoustic channel. An RF signal generating means is connected to one of the outermost positioned transducing means. A means for amplitude modulating the RF signal is also connected to the RF signal generator to provide an amplitude modulated RF signal to the other outermost transducer means. An output terminal is connected to the centrally positioned transducer means for detecting the double sideband suppressed carrier signal received by the centrally positioned transducer.

From the foregoing it can be seen that it is a primary object of the present invention to provide a novel double sideband suppressed carrier signal generator.

It is a further object of the present invention to provide a unique surface wave modulator for generating a double sideband suppressed carrier signal generator.

A further object of the present invention is to provide a modulator which requires no transformers and a minimum amount of tuning.

These and other objects of the present invention will become more apparent and better understood when taken in conjunction with the following description and drawings, wherein like characters indicate like parts and which drawings form a part of the present invention.

DESCRIPTION OF THE PREFERRED EMBODIMENTS

Figure 1:
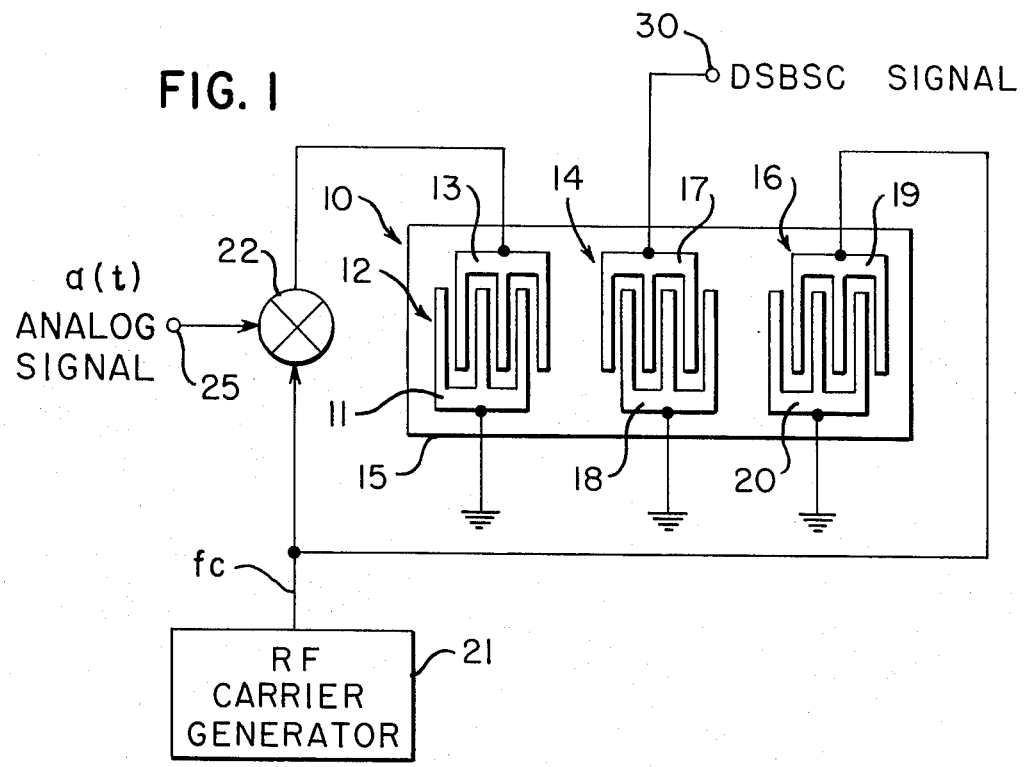
FIG. 1 illustrates schematically and pictorially a preferred embodiment of the surface wave modulator constructed in accordance with the present invention.

FIG. 1 depicts a surface wave modulator 10 comprised of two input transducers 12 and 16 and an output transducer 14, all of which are formed on a surface of a piezoelectric substrate 15. The substrate 15 may be constructed of a suitable piezoelectric material such as PZT, quartz, lithium niobate, lithium tantalate, ZnO, ZnS, CdS, or other suitable material for propagating acoustic surface waves in the frequency range of interest.

The transducers 12, 14 and 16, in the simplest arrangement, are identical and are constructed of two comb-type electrode arrays. Input transducer 12 has a first comb of electrodes 11 connected to circuit ground and a second comb of electrodes 13 connected to the output of a modulator 22. Electrodes 11 and 13 have interleaved fingers which are spaced apart from each other a distance which corresponds to one-half of the acoustic wavelength of the signal wave for which it is desired to achieve maximum response. The electrodes are formed from a material such as gold or aluminum which may be vacuum deposited or photoetched onto the surface of the piezoelectric substrate 15.

The output transducer 14 is positioned equidistant between the input transducers 12 and 16. One comb 18 of output transducer 14 is connected to circuit ground. The other comb 17 is connected to an output terminal 30.

The input transducer 16 has one comb 20 connected to circuit ground and the other comb 19 connected to the output of an RF carrier signal generator 21. The output of generator 21 is also connected to the input of modulator 22. An amplitude modulating signal $a(t)$ is applied to an input terminal 25, which terminal is connected to the modulating signal input of modulator 22. The output signal from modulator 22 is an amplitude modulated RF carrier signal of the well-known type.

In the novel method of operation the input transducers 12 and 16 operate as transmitters. An electrical signal applied to the transducers, through piezoelectric coupling, is transformed into a traveling acoustic surface wave on the substrate 15. This occurs when the strain components produced by the electric fields in the substrate are substantially matched to the strain components associated with the surface wave mode. Transducer 12 will produce the RF carrier wave and its associated sidebands. Transducer 16 will produce the RF carrier wave only. Each of these produced surface waves propagate along the substrate common acoustic channel to the output transducer 14. Transducer 14 will convert the received acoustic waves into an electrical signal. Due to the fact that the RF carrier wave components transmitted by the input transducers will be 180° out of phase when received by the output transducer 14 they will cancel and not be converted into an electrical signal. The signal from output transducer 14 will therefore be a double sideband suppressed carrier (DSBSC) signal. To achieve perfect cancellation of the RF carrier it may be necessary to adjust the amplitude of the RF carrier signal fed to transducer 16 so as to compensate for any losses incurred in signal strength in modulator 22.

Figure 2:
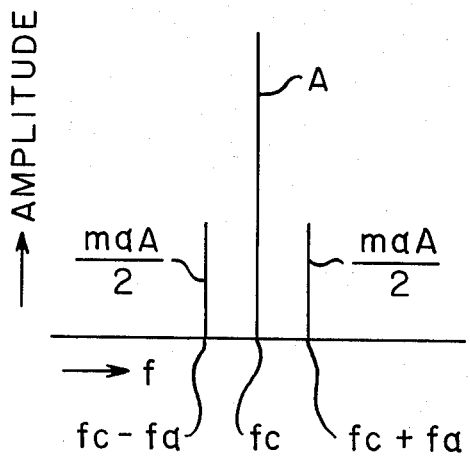
FIG. 2 illustrates the spectrum content of an amplitude modulated carrier signal.

FIG. 2 illustrates the spectrum content of the amplitude modulated signal applied to the input transducer 12. The RF carrier at frequency $f_c$ which is also applied to the input transducer 16 is shown with an amplitude many times that of the sideband signals $f_c-f_a$ and $f_c+f_a$, where $f_a$ is the frequency of the modulating signal $a(t)$. A denotes the amplitude of the unmodulated RF carrier signal, and the quantity $m_a$ represents the amplitude modulation factor. The sidebands therefore have an amplitude of $m_aA/2$.

Figure 3:
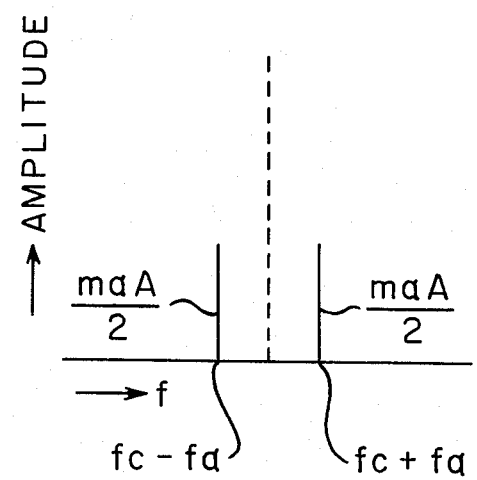
FIG. 3 illustrates the spectrum content of an amplitude modulated carrier signal with a suppressed carrier.

FIG. 3 illustrates the spectrum content of the output signal present at the output transducer 14. The unmodulated RF carrier signal component, $f_c$, is eliminated and only the two sideband signals remain.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as fall within the true scope of the invention.

What is claimed is:

1. Apparatus for generating a double sideband suppressed carrier signal comprising:
   a surface wave propagating medium;
   three spaced apart surface wave transducers positioned on a surface of said surface wave propagating medium;
   carrier signal generating means connected to an outer positioned one of said surface wave transducers;
   modulation means connected to the other outer positioned surface wave transducer for providing a modulated carrier signal; and
   terminal means connected to the inner positioned surface wave transducer for receiving the double sideband suppressed carrier signal detected by the inner positioned surface wave transducer.

2. The apparatus according to claim 1 wherein each of said transducers is comprised of a first and a second fingered array of electrodes with the fingers of said first array of electrodes interleaved with the fingers of said second array of electrodes.

3. The apparatus according to claim 2 wherein the spacing between the finger electrodes corresponds to one-half the acoustic wavelength of the carrier signal from said carrier signal generating means.

4. The apparatus according to claim 2 wherein the first array of finger electrodes of each of said transducers is connected to circuit ground.

5. The apparatus according to claim 1 in which the inner positioned surface wave transducer is equally spaced from each of the outer positioned surface wave transducers along a common axis.

6. The apparatus according to claim 1 in which the modulation means provides an amplitude modulated carrier signal.

7. Apparatus for generating a double sideband suppressed carrier signal comprising:
   an acoustic wave propagating medium;
   a pair of transducer means coupled to said propagating medium for generating acoustic surface waves in opposing directions along a common propagating path in said medium so as to cause a cancellation of common surface waves at an output position along said propagating path;
   output transducer means positioned at said output position for detecting the non-cancelled portions of said generated acoustic waves; and
   means for generating a carrier signal and a modulated carrier signal connected to a first and a second of said pair of transducer means, respectively.

8. The apparatus according to claim 7 wherein each of said transducers is comprised of a first and a second fingered array of electrodes with the fingers of said first array of electrodes interleaved with the fingers of said second array of electrodes.

9. The apparatus according to claim 8 wherein the spacing between the finger electrodes corresponds to one-half the acoustic wavelength of the carrier signal from said carrier signal generating means.

10. The apparatus according to claim 8 wherein the first array of finger electrodes of each of said transducers is connected to circuit ground.

11. Apparatus for generating a double sideband suppressed carrier signal comprising:
    a piezoelectric substrate;
    an output transducer disposed on said substrate;
    a pair of input transducers disposed on said substrate and equally spaced from said output transducer;
    means for applying a carrier signal and an amplitude modulated carrier signal to a first and a second of said pair of output transducers, respectively; and
    terminal means connected to said output transducer for receiving the signal generated therein.

12. The apparatus according to claim 11 wherein each of said transducers is an electro-acoustic surface wave transducer mechanically coupled to said substrate for generating and interacting with acoustic surface-waves on said substrate.

13. The apparatus according to claim 11 wherein each of said transducers is comprised of a first and a second fingered array of electrodes with the fingers of said first array of electrodes interleaved with the fingers of said second array of electrodes.

14. The apparatus according to claim 13 wherein the spacing between the finger electrodes corresponds to one-half the acoustic wavelength of the carrier signal from said carrier signal generating means.

15. The apparatus according to claim 13 wherein the first array of finger electrodes of each of said transducers is connected to circuit ground.

16. A method for generating a double sideband suppressed carrier signal comprising the following steps:
    generating a first acoustic signal from a carrier signal;
    generating a second acoustic signal from a modulated carrier signal;
    combining the first and second acoustic signals; and
    deriving a double sideband suppressed carrier signal from the combined first and second acoustic signals.

17. The method according to claim 16 wherein said combining step cancels the common signal components of said first and said second acoustic signal.

* * * * *